(12) United States Patent
Mi et al.

(10) Patent No.: US 12,557,676 B2
(45) Date of Patent: Feb. 17, 2026

(54) ARRAY SUBSTRATE, DISPLAY MODULE AND DISPLAY APPARATUS EACH HAVING FUNCTIONAL AREA WITH BENDING AREA

(71) Applicant: Hefei Visionox Technology Co., Ltd., Anhui (CN)

(72) Inventors: Lei Mi, Hefei (CN); Yusheng Liu, Hefei (CN); Hongrui Li, Hefei (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 365 days.

(21) Appl. No.: 18/342,061

(22) Filed: Jun. 27, 2023

(65) Prior Publication Data

US 2023/0352391 A1 Nov. 2, 2023

Related U.S. Application Data

(63) Continuation of application No. PCT/CN2022/082185, filed on Mar. 22, 2022.

(30) Foreign Application Priority Data

Jul. 26, 2021 (CN) .......................... 202110846778.4

(51) Int. Cl.
*H01L 23/498* (2006.01)

(52) U.S. Cl.
CPC .. *H01L 23/49838* (2013.01); *H01L 23/49827* (2013.01)

(58) Field of Classification Search
CPC ................... H01L 23/49838; H01L 23/49827
See application file for complete search history.

(56) References Cited

U.S. PATENT DOCUMENTS

2014/0175436 A1* 6/2014 Yamazaki ............ H10D 86/481
257/43
2014/0259602 A1 9/2014 Thompson
(Continued)

FOREIGN PATENT DOCUMENTS

CN 104752442 A 7/2015
CN 107154218 A 9/2017
(Continued)

OTHER PUBLICATIONS

Office Action issued on Jul. 18, 2023, in corresponding Chinese Application No. 202110846778.4, 5 pages.
(Continued)

*Primary Examiner* — Michael Jung
(74) *Attorney, Agent, or Firm* — Maier & Maier, PLLC

(57) ABSTRACT

An array substrate, a display module and a display apparatus and belongs to the field of display technology. The array substrate includes: first data lines located in the central area and extending along the first direction; second data lines located in the edge area and extending along the first direction; first connecting lines located between the central area and the functional area and extending along the first direction, the first connecting lines being electrically connected with the first data lines in a one-to-one correspondence; second connecting lines electrically connected with the second data lines in a one-to-one correspondence; and line-switching connecting units electrically connected with the second connecting lines and connecting ports, so that the second data lines are electrically connected, via the second connecting lines and the line-switching connecting units, with the connecting ports in an arrangement order of the second data lines.

18 Claims, 14 Drawing Sheets

(56) References Cited

U.S. PATENT DOCUMENTS

| | | | |
|---|---|---|---|
| 2018/0267657 A1 | 9/2018 | Shao et al. | |
| 2019/0272790 A1 | 9/2019 | Chang et al. | |
| 2021/0375173 A1* | 12/2021 | Wang | G09G 3/3233 |
| 2021/0408210 A1* | 12/2021 | Kang | H10K 59/131 |

FOREIGN PATENT DOCUMENTS

| | | |
|---|---|---|
| CN | 107300793 A | 10/2017 |
| CN | 207008253 U | 2/2018 |
| CN | 207517694 U | 6/2018 |
| CN | 108447887 A | 8/2018 |
| CN | 109270759 A | 1/2019 |
| CN | 109494243 A | 3/2019 |
| CN | 109541865 A | 3/2019 |
| CN | 109637372 A | 4/2019 |
| CN | 109935169 A | 6/2019 |
| CN | 110286534 A | 9/2019 |
| CN | 110416254 A | 11/2019 |
| CN | 107861279 | 2/2020 |
| CN | 111223436 A | 6/2020 |
| CN | 111930266 A | 11/2020 |
| CN | 112071209 A | 12/2020 |
| CN | 113539108 A | 10/2021 |
| JP | 2001118847 A | 4/2001 |
| JP | 2004253303 A | 9/2004 |
| JP | 2007163703 A | 6/2007 |
| JP | 2008287285 A | 11/2008 |
| JP | 2010002876 A | 1/2010 |
| KR | 1020150057323 A | 5/2015 |
| KR | 1020180030007 A | 3/2018 |
| KR | 1020180042504 A | 4/2018 |
| KR | 1020210074489 A | 6/2021 |

OTHER PUBLICATIONS

Office Action issued on Jan. 12, 2023, in corresponding Chinese Application No. 202110846778.4, 21 pages.

International Search Report issued on Jul. 19, 2022, in corresponding International Application No. PCT/CN2022/082185, 4 pages.

* cited by examiner

ARRAY SUBSTRATE, DISPLAY MODULE AND DISPLAY APPARATUS EACH HAVING FUNCTIONAL AREA WITH BENDING AREA

CROSS REFERENCE TO RELATED APPLICATION

The present application is a continuation of International Application No. PCT/CN2022/082185 filed on Mar. 22, 2022, which claims priority to Chinese Patent Application No. 202110846778.4 filed on Jul. 26, 2021, both of which are incorporated herein by reference in their entireties.

TECHNICAL FIELD

The present application relates to the field of display technology, and particularly, to an array substrate, a display module and a display apparatus.

BACKGROUND

With the development of display technology, demands of users for the screen-to-body ratio are higher and higher, the narrow frame design has become a major development trend for the display apparatus.

The display apparatus includes a display area and a non-display area. The non-display area includes a sector wiring area, in which a great number of lines are arranged, however, the lines occupy a large space and thus the width of the sector wiring area is large, the frame of the display apparatus cannot be further narrowed and it is difficult to achieve a narrower frame for the display apparatus.

SUMMARY

Embodiments of the present application provide an array substrate, a display module and a display apparatus, which can achieve a narrower frame for the display apparatus.

In a first aspect, the embodiments of the present application provide an array substrate including a display area and a non-display area, the non-display area includes a functional area spaced from the display area in a first direction, the display area includes a central area and an edge area located on at least a side of the central area along a second direction, the array substrate includes: a plurality of first data lines located in the central area and extending along the first direction, the plurality of first data lines being arranged at intervals along the second direction; a plurality of second data lines located in the edge area and extending along the first direction, the plurality of second data lines being arranged at intervals along the second direction; a plurality of first connecting lines located between the central area and the functional area and extending along the first direction, the first connecting lines being electrically connected with the first data lines in a one-to-one correspondence; a plurality of second connecting lines electrically connected with the second data lines in a one-to-one correspondence, the second connecting line including a first connecting line segment and a second connecting line segment distributed successively, the first connecting line segment being a bending line extending in the display area, the second connecting line segment extending along the first direction between the central area and the functional area; and a plurality of line-switching connecting units configured to be electrically connected with the second connecting lines and connecting ports, so that the second data lines are electrically connected, via the second connecting lines and the line-switching connecting units, with the connecting ports arranged in an order corresponding to an arrangement order of the second data lines, the connecting ports being electrically connected with a driver integrated circuit chip.

In a second aspect, the embodiments of the present application provide a display module including the array substrate of the first aspect.

In a third aspect, the embodiments of the present application provide a display apparatus including the display module of the second aspect.

The present application provides an array substrate, a display module and a display apparatus, the array substrate includes the first data lines located in the central area and the second data lines located in the edge area. The first data lines are connected to the functional area through the first connecting lines. The second data lines are connected to the functional area through the second connecting lines. The second connecting line includes the first connecting line segment and the second connecting line segment. The first connecting line segment is a bending line extending in the display area, and the second connecting line segment extends along the first direction between the central area and the functional area. The first connecting lines and the second connecting line segments between the central area and the functional area all extend along the first direction and do not form a sector wiring area, and are not limited by the shape of the sector wiring area. Moreover, the line-switching connecting units can enable that the second data lines are electrically connected, via the second connecting lines and the line-switching connecting units, with the connecting ports arranged in an order corresponding to an arrangement order of the second data lines, therefore the distance between the central area and the functional area is not effected and can be further reduced, a narrower frame can be achieved for the display apparatus.

DETAILED DESCRIPTION

Features and exemplary embodiments of various aspects of the present application will be described in detail below, and in order to make the purpose, technical solutions and advantages of the present application clearer, the present application is described in further detail below in combination with the accompanying drawings and specific embodiments.

Figure 1:
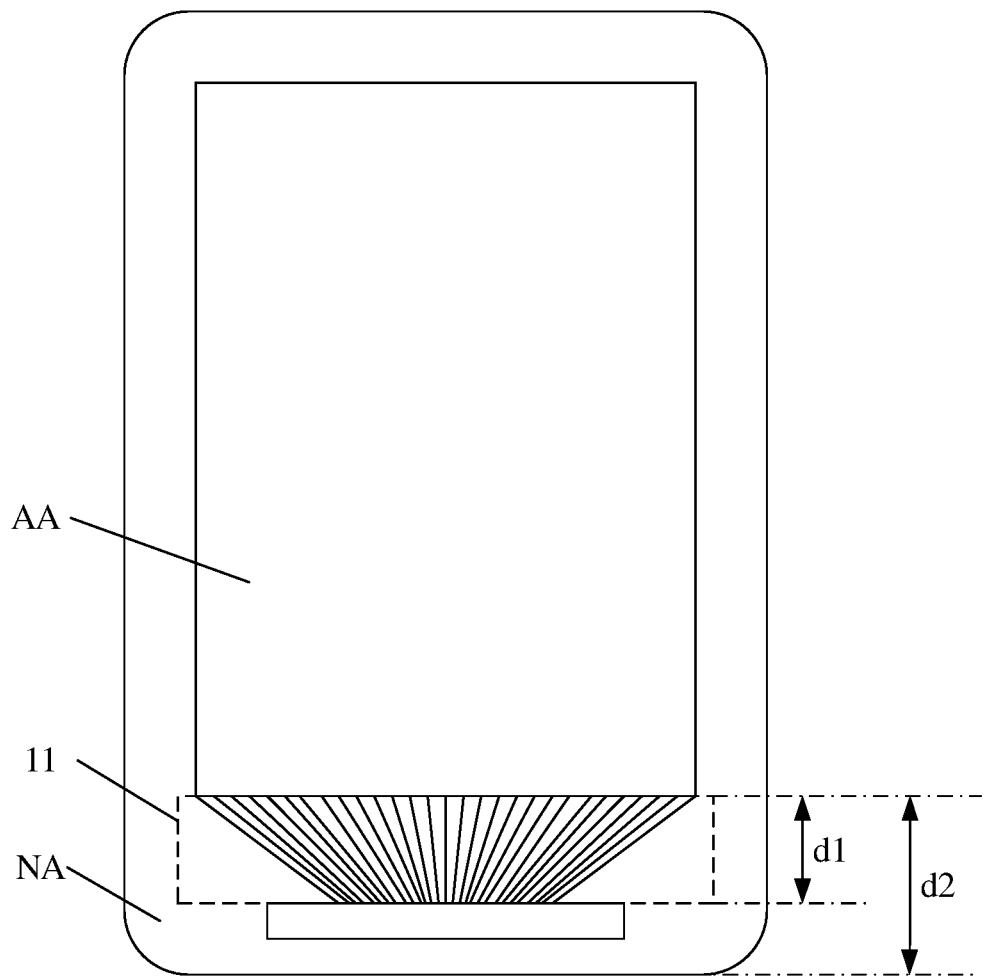
FIG. 1 shows a schematic top view of an example of a display apparatus.

With the development of display technology, demands of users for the screen-to-body ratio are higher and higher, the narrow frame design has become a major development trend for the display apparatus. As shown in FIG. 1, the display apparatus includes a display area AA and a non-display area NA. A sector wiring area 11 is arranged in the non-display area NA, i.e., the lines in the non-display area NA may form a trapezoidal area. A lot of lines are arranged in the sector wiring area 11, and if the number of the lines is very great, the width d1 of the sector wiring area 11 is limited by the shape of the sector wiring area 11 and cannot be further reduced, i.e., the width d1 of the sector wiring area 11 is large and thus the width of the non-display area is large, therefore, the width d2 of the frame of the display apparatus, especially the lower frame, cannot be further reduced, and it is difficult to achieve a narrower frame for the display apparatus.

The present application provides an array substrate, a display module and a display apparatus, which can further reduce the width of the non-display area by adjusting the wiring of the data lines, so as to further narrow the frame of the display apparatus to achieve a narrower frame for the display apparatus.

Figure 2:
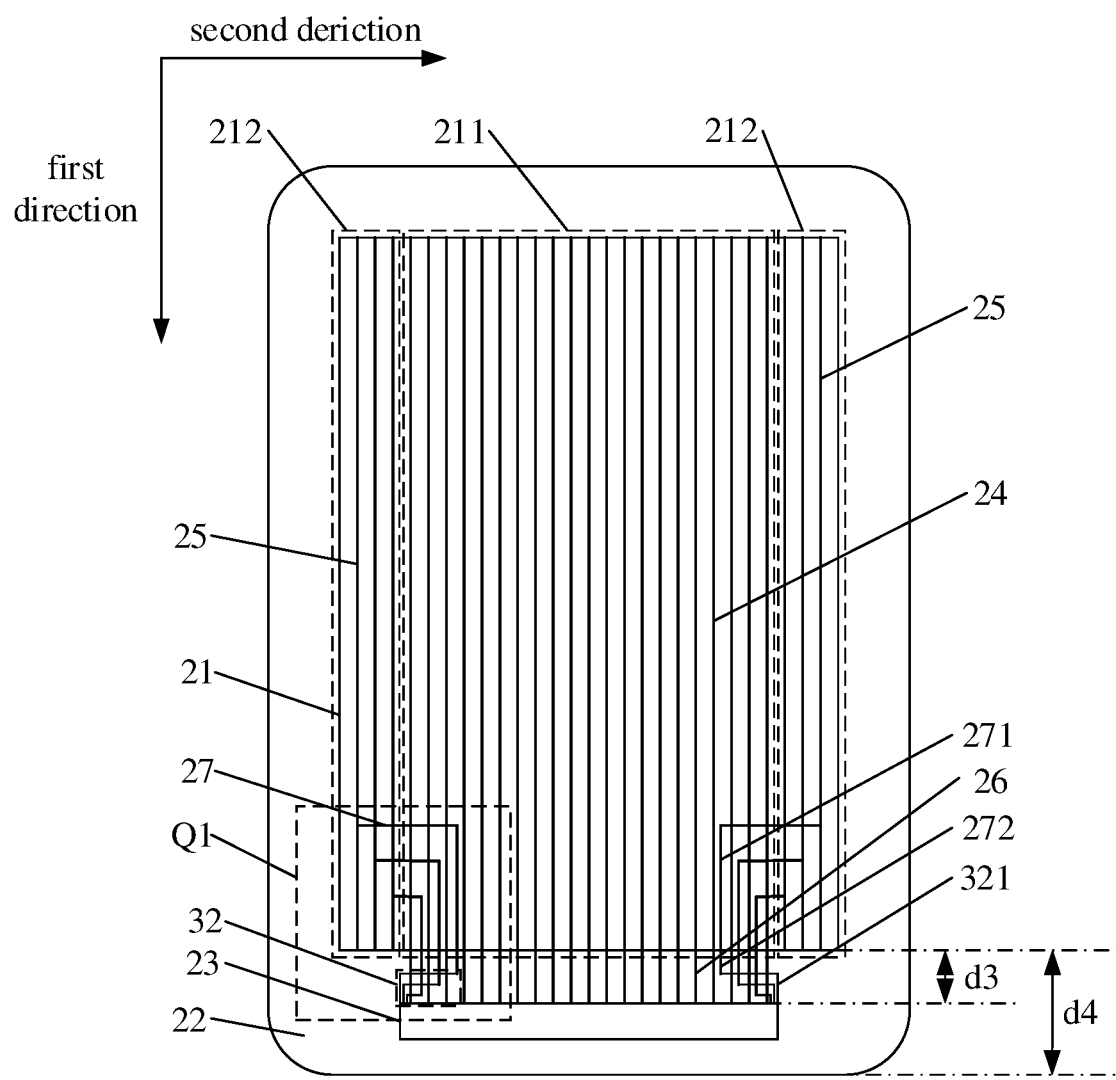
FIG. 2 shows a schematic structural diagram of an embodiment of an array substrate according to the present application.
Figure 3:
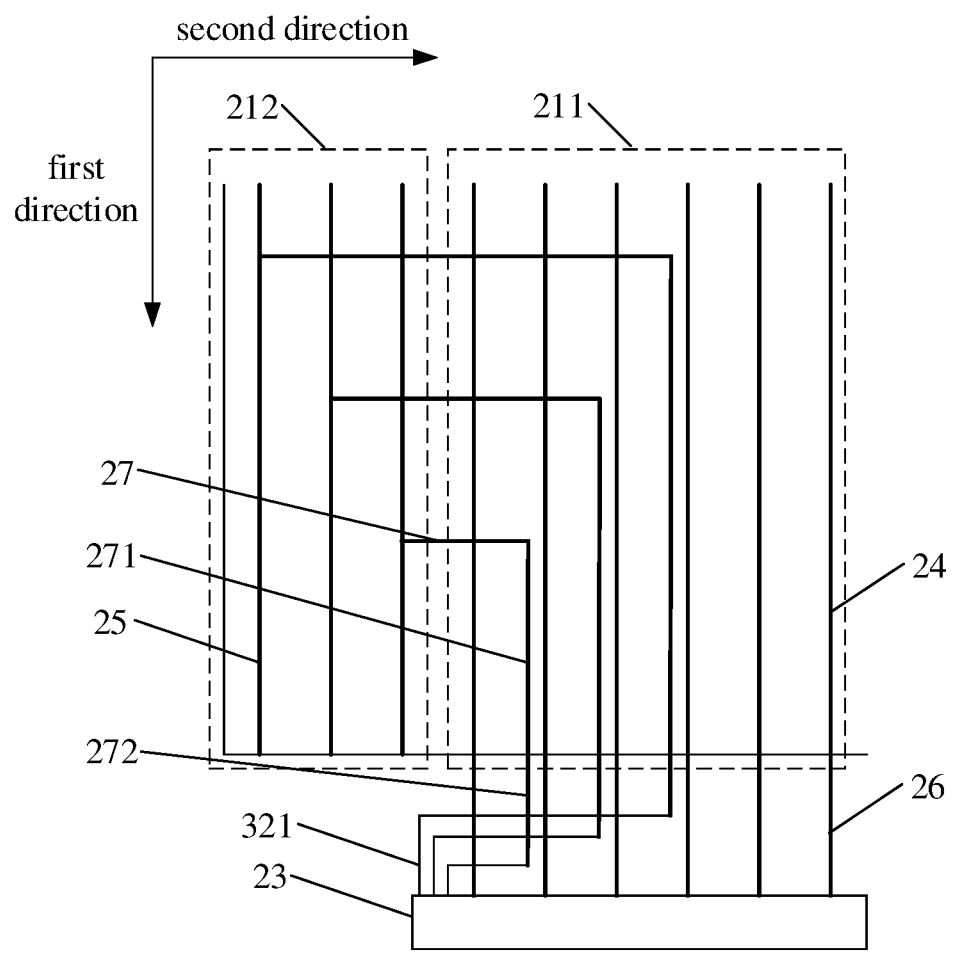
FIG. 3 shows a partially enlarged diagram of area Q1 in FIG. 2.

As shown in FIGS. 2 and 3, the array substrate includes a display area 21 and a non-display area 22. The non-display area 22 includes a functional area 23 spaced from the display area 21 in a first direction. The display area includes a central area 211 and an edge area 212 located on at least a side of the central area 211 along a second direction.

The functional area 23 may include components and areas for performing one or more certain functions, which are not limited herein. For example, if a display module including the array substrate is packaged in Chip On Pi (COP) package or Chip On Film (COF) package, the functional area 23 may include a bending area. For another example, if a display module including the array substrate is packaged in Chip On Glass (COG) package, the functional area 23 may include an IC chip.

In the above embodiments, the first direction and the second direction are different and may be at some angle. In some examples, the first direction and the second direction are perpendicular to each other. In some examples, the first direction may be a column direction of the pixel units in the display area, and the second direction may be a row direction of the pixel units in the display area.

The edge area 212 may be located on one side or two sides of the central area 211 along the second direction, that is, the central area 211 may be correspondingly provided with one edge area 212 or two edge areas 212, which is not limited herein. In some examples, the edge area 212 is an area of the central area 211 protruding relative to the functional area 23 along the second direction, that is, a projection of the central area 211 along the first direction overlaps a projection of the functional area 23 along the first direction. A projection of the edge area 212 along the first direction does not overlap the projection of the functional area 23 along the first direction.

The array substrate may include a plurality of first data lines 24, a plurality of second data lines 25, a plurality of first connecting lines 26, a plurality of second connecting lines 27, and a plurality of line-switching connecting units 32.

The first data lines 24 are located in the central area 211 and extend along the first direction, and the plurality of first data lines 24 are arranged at intervals along the second direction. The number of the first data lines 24 as shown in FIGS. 2 and 3 is only illustrative, and in practice, the number of the first data lines 24 in the central area 211 will be greater. For example, a display apparatus including the array substrate has a resolution of 2340*1080, and the number of the first data lines 24 may be 1440.

The second data lines 25 are located in the edge area 212 and extend along the first direction, and the plurality of second data lines 25 are arranged at intervals along the second direction. The number of the second data lines 25 as shown in FIGS. 2 and 3 is only illustrative, and in practice, the number of the second data lines 25 in the edge area 212 will be greater. For example, a display apparatus including the array substrate has a resolution of 2340*1080, and the number of the second data lines 25 may be 720.

The first data lines 24 and the second data lines 25 may provide data signals for the pixel units in the display area 21.

The first connecting lines 26 are located between the central area 211 and the functional area 23 and extend along the first direction, and the first connecting lines 26 are electrically connected with the first data lines 24 in a one-to-one correspondence. The first data lines 24 are connected to the functional area 23 through the first connecting lines 26, and the first data lines 24 and the first connecting lines 26 may be integrally manufactured.

The second connecting lines 27 are located in the display area AA, as well as between the display area AA and the functional area 23, the second connecting lines 27 are electrically connected with the second data lines 25 in a one-to-one correspondence, and the second data lines 25 are connected to the functional area 23 through the second connecting lines 27.

The second connecting line 27 may include a first connecting line segment 271 and a second connecting line segment 272 distributed successively, which are electrically connected. That is, one first connecting line segment 271 and one second connecting line segment 272 form one second connecting line 27. Specifically, one end of the first connecting line segment 271 is electrically connected with the second data line 25, the other end of the first connecting line segment 271 is electrically connected with one end of the second connecting line segment 272, and the other end of the second connecting line segment 272 is electrically connected with the functional area 23.

The first connecting line segment 271 is a bending line extending in the display area 21 and may be bent for one time or multiple times in the display area 21, which is not limited herein. The first connecting line segment 271 may pass through the edge area 212 and the central area 211. The first connecting line segment 271 as shown in FIGS. 2 and 3 is bent once in the display area.

Figure 4:
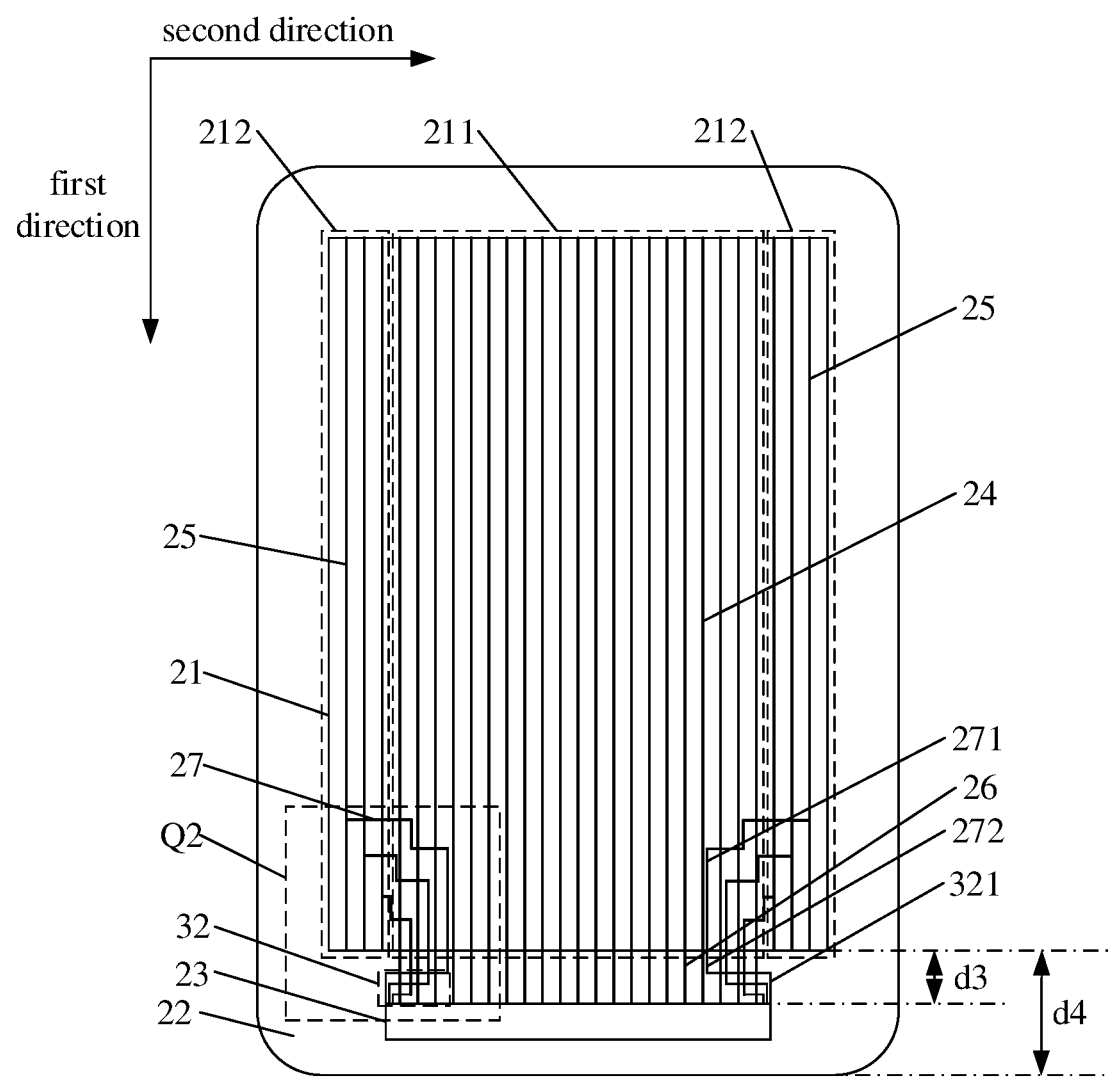
FIG. 4 shows a schematic structural diagram of another embodiment of an array substrate according to the present application.
Figure 5:
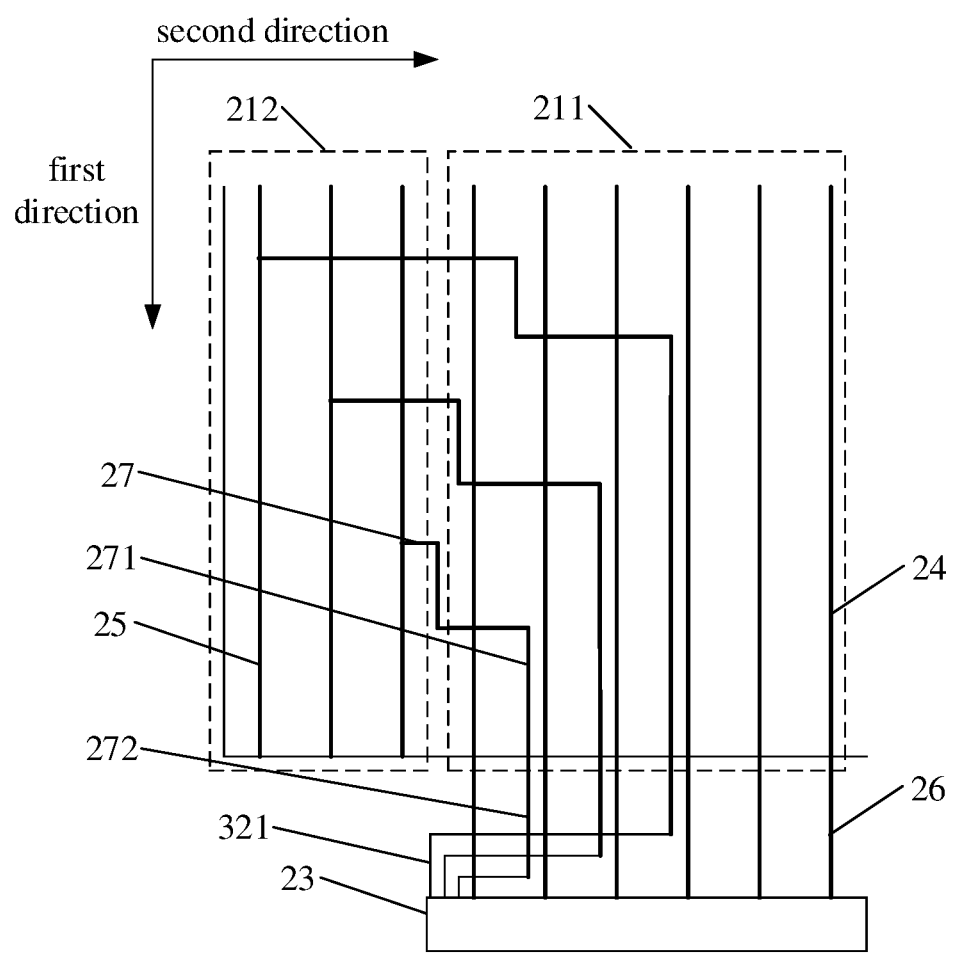
FIG. 5 shows a partially enlarged diagram of area Q2 in FIG. 4.

As shown in FIGS. 4 and 5, the first connecting line segment 271 may be bent for multiple times in the display area.

The second connecting line segment 272 extends along the first direction between the central area 211 and the functional area 23.

The first data line 24 may be electrically connected with a connecting port through the first connecting line 26 or through the first connecting line 26 and other structures. The connecting port is electrically connected with a driver integrated circuit chip, i.e., a driver IC chip. The second data line 25 may be electrically connected with the driver IC chip through the second connecting line 27 or through the second connecting line 27 and other structures. Since the second connecting lines 27 are bent, the arrangement order of the first connecting lines 26 and the second connecting lines 27 is different from the arrangement order of the first data lines 24 and the second data lines 25 in the display area 21, while the arrangement order of the output pins of the driver IC chip is generally consistent with the arrangement order of the first data lines 24 and the second data lines 25 in the display area 21, and the arrangement order of the connecting ports is consistent with the arrangement order of the output pins of the driver IC chip, in order to enable the data signal to be transmitted to the correct first data line 24 and the correct second data line 25 through the first connecting line 26 and the second connecting line 27, the array substrate needs to be improved. The line-switching connecting units 32 in the array substrate are configured to be electrically connected with the second connecting lines 27 and the connecting ports, so that the second data lines 25 are connected, via the second connecting lines 27 and the line-switching connecting units 32, with the connecting ports arranged in an order corresponding to the arrangement order of the second data lines 25. The line-switching connecting units may be arranged between the display area 21 and the connecting ports.

The first connecting lines 26 and the second connecting line segments 272 between the central area 211 and the functional area 23 all extend along the first direction and do not form a sector wiring area, and are not limited by the shape of the sector wiring area. The distance d3 between the central area 211 and the functional area 23 can be further reduced, and correspondingly, the width d4 of the lower frame of the display apparatus including the array substrate can be further shortened. The d3 in FIG. 4 is less than the d1 in FIG. 1, and the d4 in FIG. 4 is less than the d2 in FIG. 1.

In the embodiments of the present application, the array substrate includes the first data lines 24 located in the central area 211 and the second data lines 25 located in the edge area 212. The first data lines 24 are connected to the functional area 23 through the first connecting lines 26. The second data lines 25 are connected to the functional area 23 through the second connecting lines 27. The second connecting line 27 includes the first connecting line segment 271 and the second connecting line segment 272. The first connecting line segment 271 is a bending line extending in the display area 21, and the second connecting line segment 272 extends along the first direction between the central area 211 and the functional area 23. The first connecting lines 26 and the second connecting line segments 272 between the central area 211 and the functional area 23 all extend along the first direction and do not form a sector wiring area, and are not limited by the shape of the sector wiring area. Moreover, the line-switching connecting units 32 can enable that the second data lines 25 are electrically connected, via the second connecting lines 27 and the line-switching connecting units 32, with the connecting ports arranged in an order corresponding to an arrangement order of the second data lines 25, therefore the distance between the central area 211 and the functional area 23 is not effected and can be further reduced, a narrower frame can be achieved for the display apparatus.

For example, in the current display apparatus, the distance between the display area and the functional area is about 1.0 mm and the width of the lower frame is about 2.5 mm to 3 mm, while in the display apparatus including the array substrate according to the embodiments of the present application, the distance between the display area and the functional area can be further reduced to about 0.5 mm or less and the width of the lower frame can be reduced to 2 mm or even less.

Moreover, the second data line 25 may be electrically connected to the correct connecting port through the line-switching connecting unit 32, i.e., the order of the second connecting lines 27 is sorted into the correct order which can be corresponding to the normal order of the connecting ports, it is not necessary to change the original arrangement order of the connecting ports or develop new driver IC chips, thereby avoiding the increase in cost of the array substrate, the display module and the display apparatus and allowing conventional wiring operations.

In some examples, the line-switching connecting unit 32 may include line-switching connecting lines 321. As shown in FIGS. 2-5, the line-switching connecting lines 321 are electrically connected with the second connecting lines 27 in a one-to-one correspondence and electrically connected with the connecting ports in an order corresponding to the connected second connecting lines 27.

Figure 6:
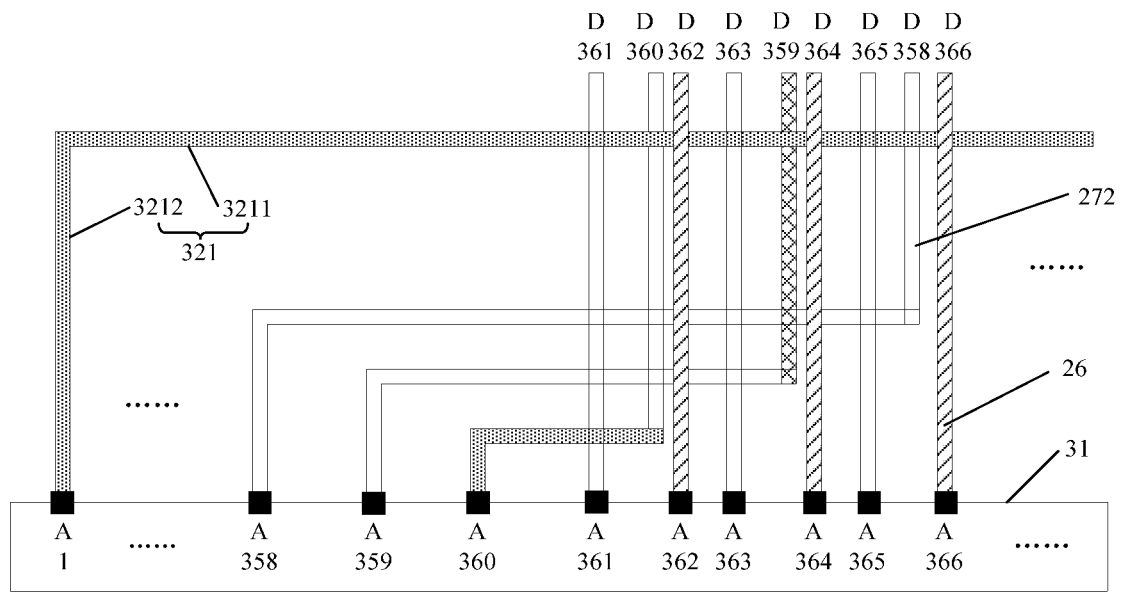
FIG. 6 shows a schematic diagram of an example of connections between line-switching connecting units and second connecting lines according to the embodiments of the present application.

For illustration, in the following, for example, the second data line 25 is directly connected to the line-switching connecting unit 32 through the second connecting line 27. As shown in FIG. 6, the black boxes indicate the connecting ports, including connecting ports A1 to A360, which are in a one-to-one correspondence with the second data lines D1 to D360. However, since the second connecting line 27 is bent in the display area, the second connecting line segment 272 is located between two adjacent first connecting lines 26, and in FIG. 6, the second data lines 25 corresponding to the second connecting line segments from left to right are D360 to D1, respectively. For illustration, the label of the second data line corresponding to the second connecting line segment 272 is indicated above the second connecting line segment, the label of the first data line corresponding to the first connecting line 26 is indicated above the first connecting line, and the first data lines are D361 to D1080, but only a part of the second connecting line segments 272 and the first connecting lines 26 are shown in FIG. 6. The second connecting lines 27 corresponding to the second data lines 25 are electrically connected to the connecting ports through a plurality of line-switching connecting lines 321. The second connecting line segments corresponding to the second data lines D360 to D1 are connected to the connecting ports A1 to A360 through a plurality of line-switching connecting lines 321, in which the second connecting line segment corresponding to the second data line D1 is connected to the connecting port A1 through the line-switching connecting line 321, the second connecting line segment corresponding to the second data line D2 is connected to the connecting port A2 through the line-switching connecting line 321, and the second connecting line segment corresponding to the second data line D3 is connected to the connecting port A3 through the line-switching connecting line 321, and so on, and the second connecting line segment corresponding to the second data line D360 is connected to the connecting port A360 through the line-switching connecting line 321.

As shown in FIG. 6, the line-switching connecting line 321 includes a first line-switching connecting line segment 3211 extending along the second direction and a second line-switching connecting line segment 3212 extending along the first direction. Two ends of the first line-switching connecting line segment 3211 are electrically connected with the second connecting line 27 and the second line-switching connecting line segment 3212, respectively, and the second line-switching connecting line segment 3212 is electrically connected with the connecting port.

Figure 7:
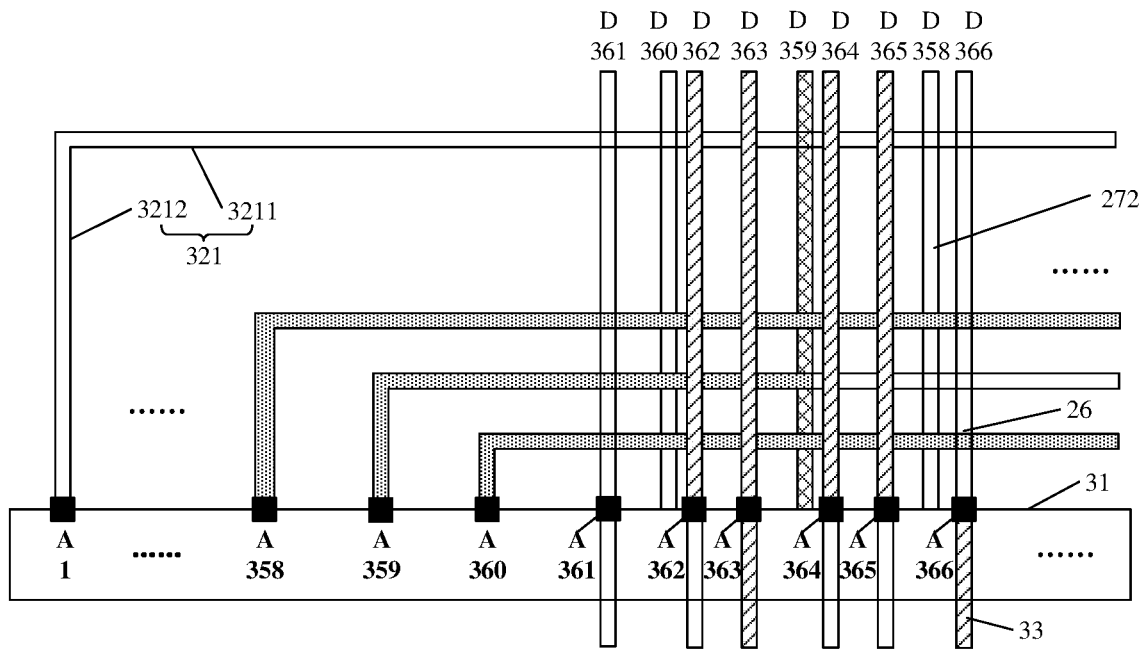
FIG. 7 shows a schematic diagram of another example of connections between line-switching connecting units and second connecting lines according to the embodiments of the present application.

The line-switching connecting line 321 may generate capacitance with other structures in the array substrate, and the resistance of the line-switching connecting line 321 itself will also affect signal transmission. In order to reduce or avoid signal transmission difference due to great capacitance difference or great resistance difference among different line-switching connecting lines 321 so that the capacitances generated by various line-switching connecting lines 321 with other structures in the array substrate tend to be the same and the resistances of various line-switching connecting lines 321 also tend to be the same, length difference among various line-switching connecting lines 321 may be reduced. As shown in FIG. 7, the first line-switching connecting line segment 3211 may extend in a direction from the edge area 212 to the central area 211 and beyond the second connecting line 27 nearest to a center of the central area 211, so that the absolute value of the length difference among various line-switching connecting lines 321 is less than an acceptable threshold and the wiring is more uniform.

Since the second connecting line 27 connected with the second data line 25 has bent parts, a sum of the lengths of the second data line 25 and the second connecting line 27 is greater than a sum of the lengths of the first data line 24 and the first connecting line 26, and in order to reduce the difference between the capacitance of the second data line 25 and the second connecting line 27 and the capacitance of the first data line 24 and the first connecting line 26 and to reduce the difference between the resistance of the second data line 25 and the second connecting line 27 and the resistance of the first data line 24 and the first connecting line 26, the array substrate may further include compensation lines. As shown in FIG. 7, the compensation line 33 is electrically connected with the first connecting line 26. The compensation line 33 is located between the connecting port and the driver integrated circuit chip and extends along the first direction. The difference between the capacitance of the second data line 25 and the second connecting line 27 and the capacitance of the first data line 24, the first connecting line 26 and the compensation line 33 is small, and the difference between the resistance of the second data line 25 and the second connecting line 27 and the resistance of the first data line 24, the first connecting line 26 and the compensation line 33 is also small, therefore signal transmission difference due to great capacitance difference or great resistance difference among different lines is reduced or avoided, so that the capacitances generated by various lines with other structures in the array substrate tend to be the same and the resistances of various lines also tend to be the same, the signal transmission is improved and thus the display effect is enhanced.

Figure 8:
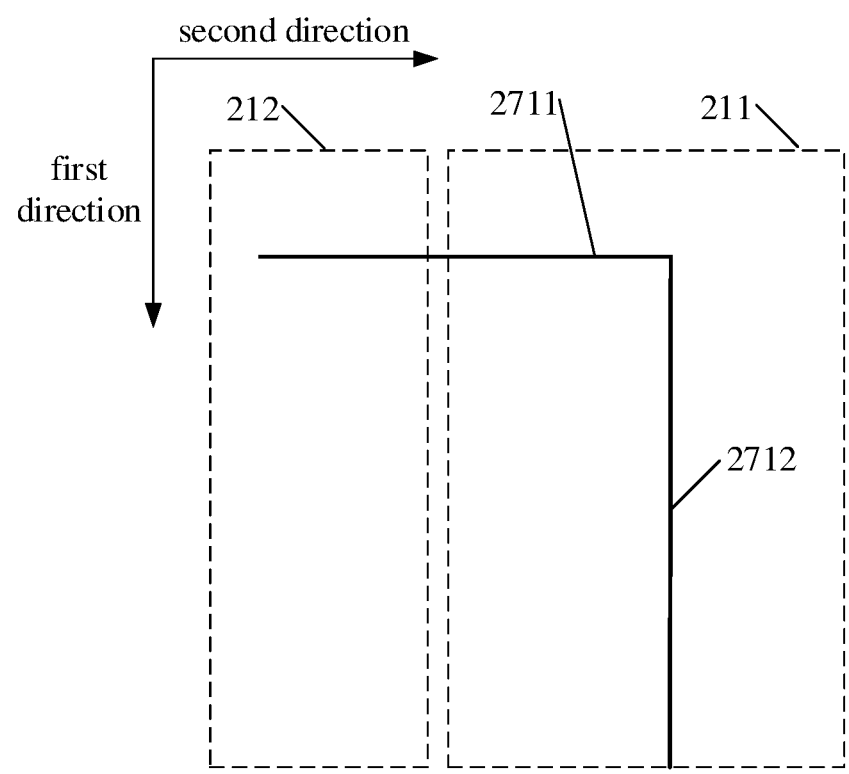
FIG. 8 shows an example of a first connecting line segment according to the embodiments of the present application.

In some examples, in order to reduce the length of the second connecting line 27, the first connecting line segment may be a bending line which is bent once in the display area. Specifically, as shown in FIG. 8, the first connecting line segment 271 includes a first connecting sub-line segment 2711 extending along the second direction and a second connecting sub-line segment 2712 extending along the first direction, and the first connecting sub-line segment 2711 is electrically connected with the second connecting sub-line segment 2712. By reducing the number of bends of the first connecting line segment 271, the length of the second connecting line 27 can be reduced to decrease the resistance, capacitance, etc. of the second data line 25 and the second connecting line 27, so as to avoid a great difference between the resistance, capacitance, etc. of the electrically connected second data line 25 and the second connecting line 27 and the resistance, capacitance, etc. of the electrically connected first data line 24 and the first connecting line 26, the display effect of the display apparatus including the array substrate is ensured.

Figure 9:
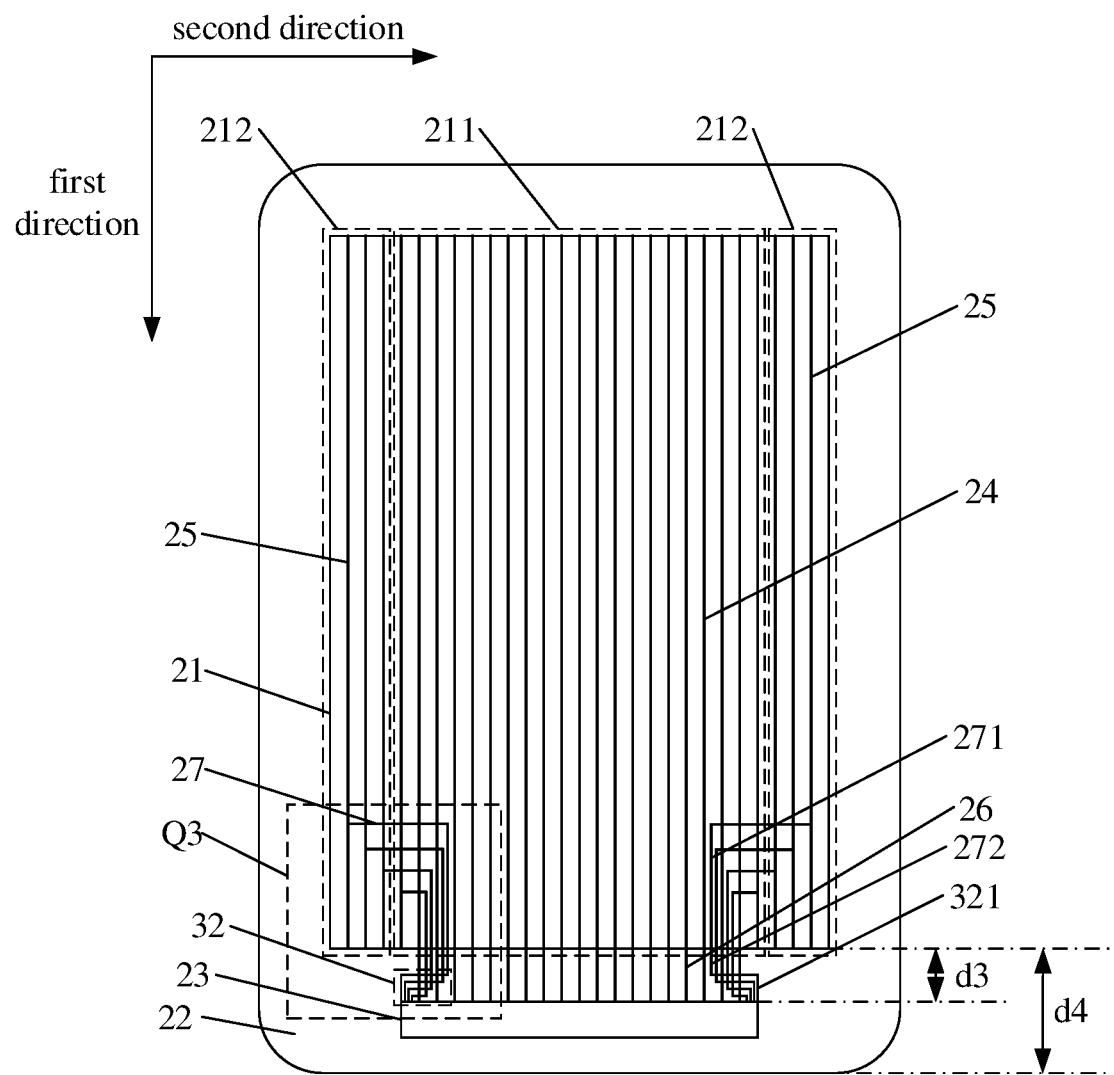
FIG. 9 shows a schematic structural diagram of yet another embodiment of an array substrate according to the present application.
Figure 10:
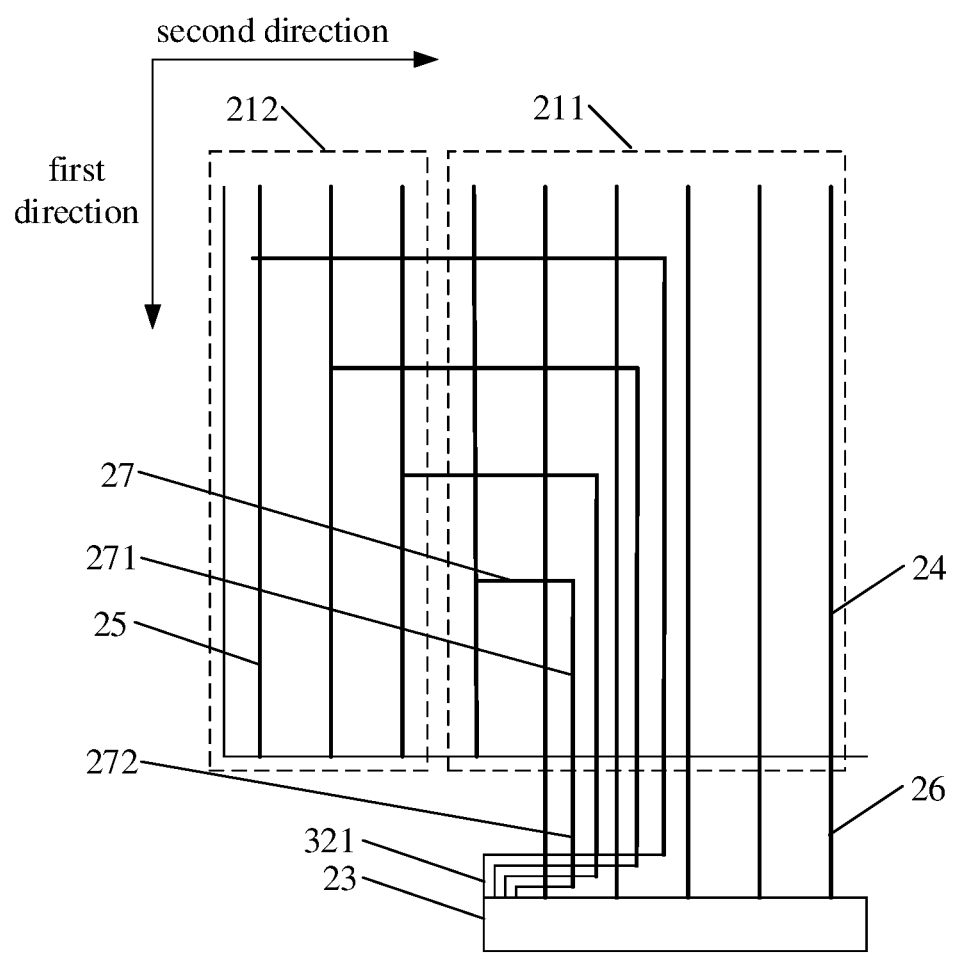
FIG. 10 shows a partially enlarged diagram of area Q3 in FIG. 9.

In some examples, a part of at least one first connecting line segment 271 extending along the first direction is located between adjacent two of the first data lines 24. That is, the part of at least one first connecting line segment 271 extending along the first direction may be arranged between two adjacent first data lines 24. Since a great number of second data lines 25 are located in the edge area 212, if the part of only one first connecting line segment 271 extending along the first direction is arranged between two adjacent first data lines 24, the difference between the length of the first connecting line segment 271 between the two adjacent first data lines 24 passing through the center of the central area 211 and the length of the first connecting line segment 271 between the two adjacent first data lines 24 adjacent to the edge area 212 may be great, i.e., the length difference among a plurality of first connecting line segments 271 is great and the uniformity is poor. In order to reduce the length difference among a plurality of first connecting line segments 271 and to ensure the display effect of the display apparatus including the array substrate, the parts of two or more first connecting line segments 271 extending along the first direction may be located between two adjacent first data lines 24, that is, the parts of two or more first connecting line segments 271 extending along the first direction may be arranged between two adjacent first data lines 24. As shown in FIGS. 9 and 10, the parts of two first connecting line segments 271 extending along the first direction are located between two adjacent first data lines 24. That is, the parts of two first connecting line segments 271 extending along the first direction are arranged between two adjacent first data lines 24. The distance between the part of the first connecting line segment 271 extending along the first direction and the adjacent first data line 24 is less than the distance between the two adjacent data lines. The distance between the first connecting line segment and the boundary of a pixel unit formed by the data lines is equal to or less than the size of the pixel unit, i.e., pixel pitch.

Specifically, if the first connecting line segment 271 is a bending line which is bent once, then each first connecting line segment 271 may include a first connecting sub-line segment 2711 extending along the second direction and a second connecting sub-line segment 2712 extending along the first direction, at least one second connecting sub-line segment 2712 is located between two adjacent first data lines 24, i.e., at least one second connecting sub-line segment 2712 is arranged between two adjacent first data lines 24. As shown in FIGS. 9 and 10, two second connecting sub-line segments 2712 are located between two adjacent first data lines 24, i.e., two second connecting sub-line segments 2712 are arranged between two adjacent first data lines 24.

Figure 11:
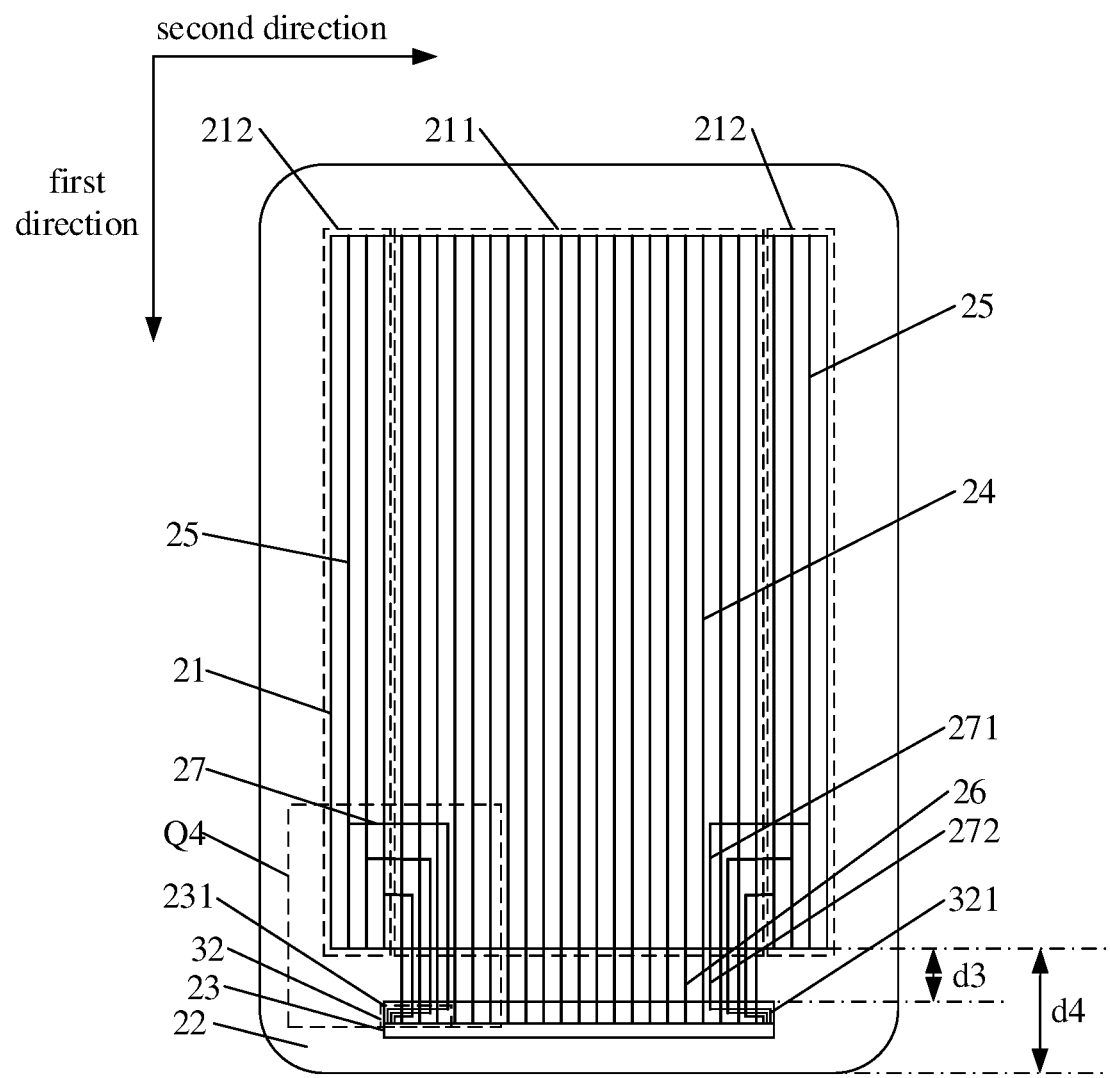
FIG. 11 shows a schematic structural diagram of yet another embodiment of an array substrate according to the present application.
Figure 12:
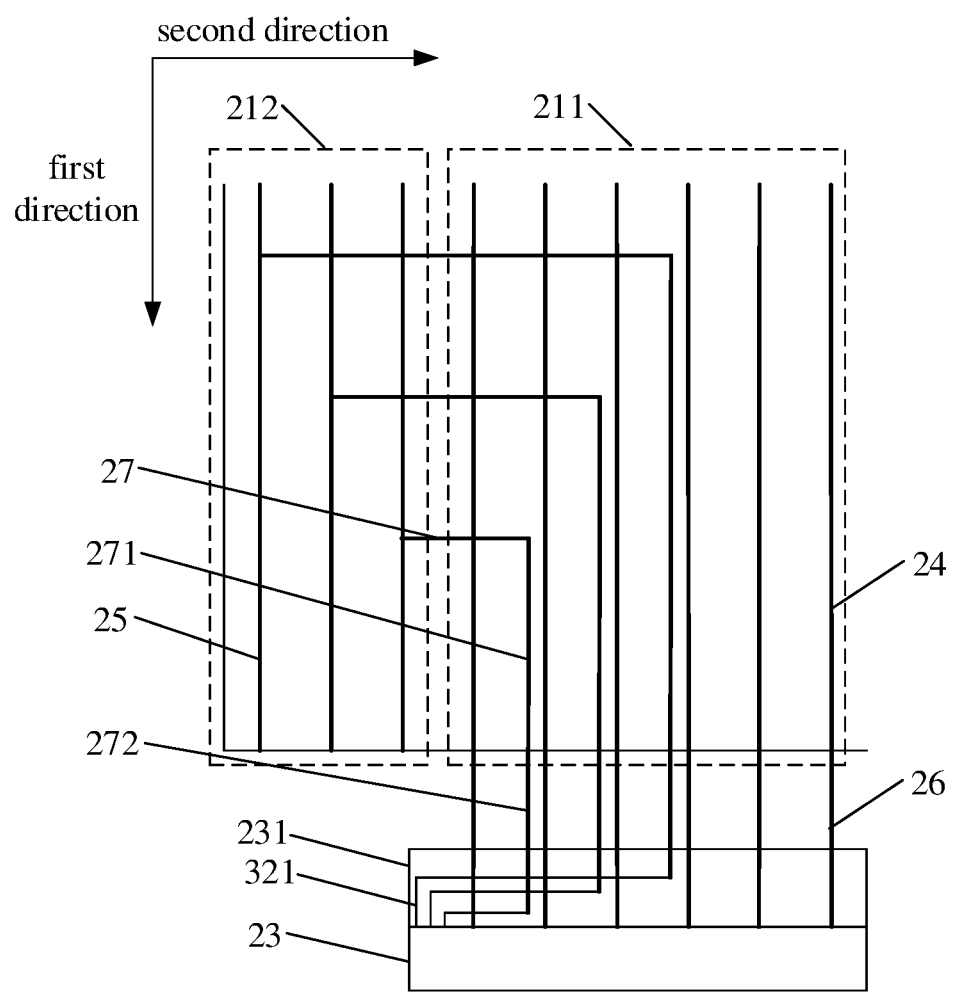
FIG. 12 shows a partially enlarged diagram of area Q4 in FIG. 11.

In some examples, the functional area 23 includes a bending area 231. Under a condition that a length of the bending area 231 along the second direction is equal to a length of the functional area 23 along the second direction, the first connecting line 26 and the second connecting line 27 extend into the bending area 231 along the first direction. Specifically, a part of the first connecting line 26 within the bending area 231 and a part of the second connecting wire 27 within the bending area 231 both extend along the first direction. As shown in FIGS. 11 and 12, the first connecting line 26 and the second connecting line 27 extend into the bending area 231 and extend in the bending area 231 along the first direction.

Figure 13:
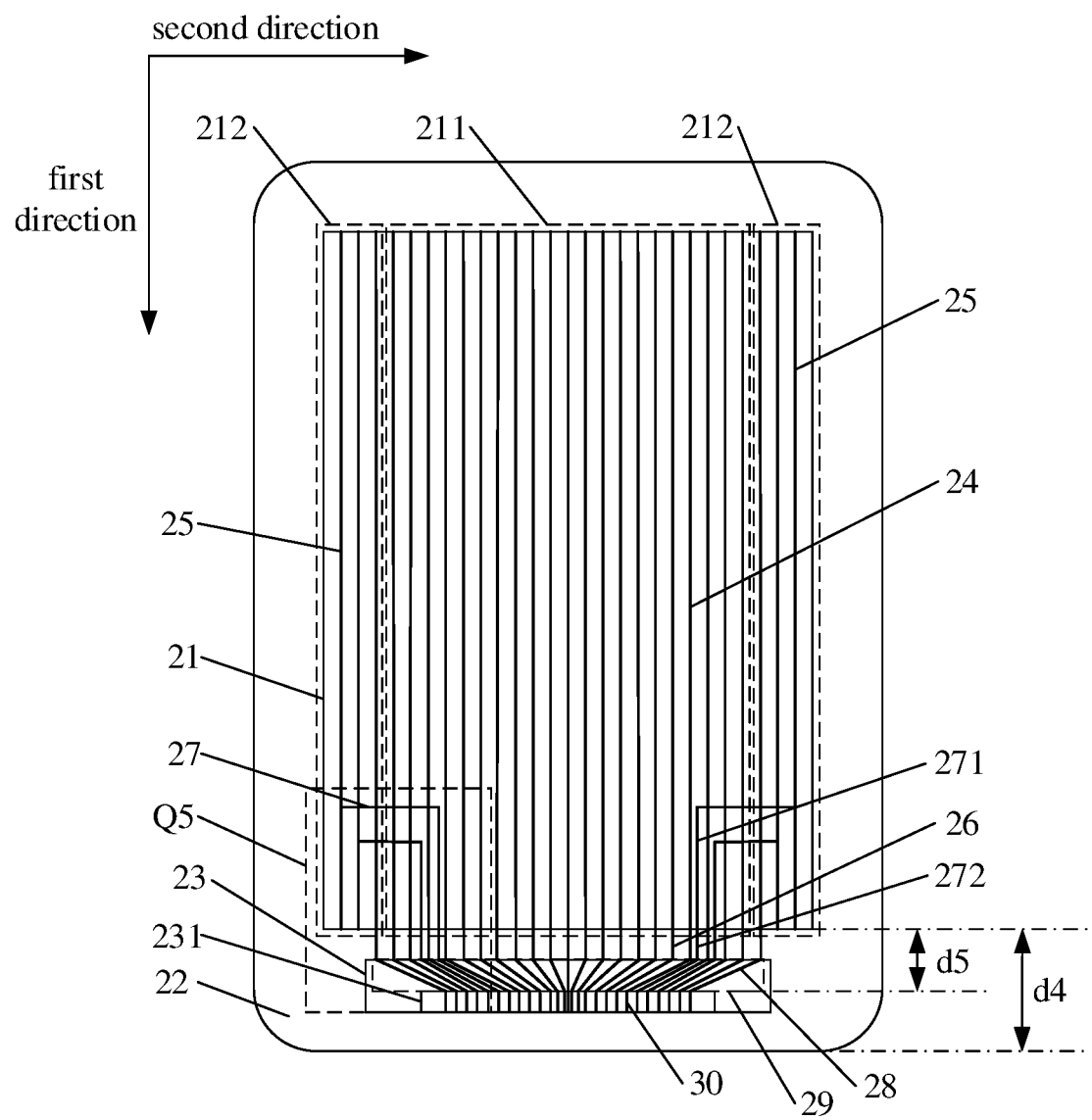
FIG. 13 shows a schematic structural diagram of yet another embodiment of an array substrate according to the present application.
Figure 14:
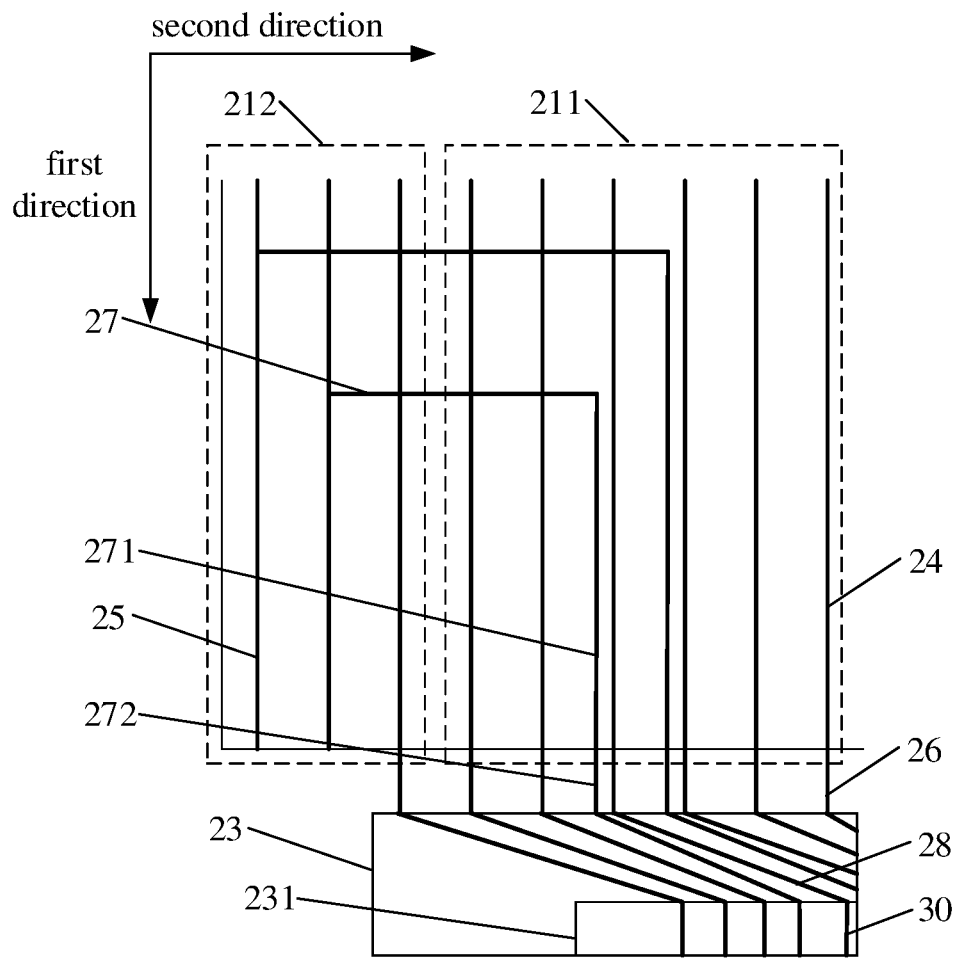
FIG. 14 shows a partially enlarged diagram of area Q5 in FIG. 13.

In some other examples, as shown in FIGS. 13 and 14, the functional area 23 includes the bending area 231. Under a condition that the length of the bending area 231 along the second direction is less than the length of the functional area 23 along the second direction, the array substrate may further include third connecting lines 28. The size of the bending area 231 may be set according to the specific demands of the array substrate, and the length of the functional area 23 along the second direction may be set to be greater than the length of the bending area 231 along the second direction. As shown in FIG. 14, the bending area 231 is located in the functional area 23 with a certain distance between the bending area 231 and a side of the functional area 23 close to the central area 211. The third connecting lines 28 are located between the bending area 231 and the side of the functional area 23 close to the central area 211. The third connecting lines 28 are electrically connected with the second connecting line segments 272 and the first connecting lines 26 in a one-to-one correspondence. An area on the array substrate in which a plurality of third connecting lines 28 are located forms a sector wiring area 29. The electrically connected third connecting line 28 and second connecting line segment 272 may be integrally manufactured, and the electrically connected third connecting line 28 and first connecting line 26 may be integrally manufactured.

By setting the length of the functional area 23 along the second direction to be greater than the length of the bending area 231 along the second direction, the number of the second data lines 25 can be reduced as much as possible to reduce the number of the second connecting lines 27, so that the voltage and current of the data signals transmitted through the first data lines 24 and the second data lines 25 are more uniform, the load difference due to the different lengths of the first connecting lines 26 and the second connecting lines 27 is reduced, the display effect of the display apparatus including the array substrate is ensured.

Moreover, with the bending of the second connecting line 27, the length of the upper edge of the sector wiring area 29 formed by the third connecting lines 28 (i.e., the edge adjacent to the side of the functional area 23 close to the central area 211) is less, and with the shorter upper edge, the width of the sector wiring area 29 is less than the width of the sector wiring area 11 in FIG. 1, and the distance d5 between the display area 21 and the bending area 231 is less than the width of the sector wiring area 11 in FIG. 1. The array substrate according to the embodiments of the present application is still able to further reduce the width of the non-display area NA, and thus further reduce the width of the frame of the display apparatus, especially the width of the lower frame.

In some examples, as shown in FIGS. 13 and 14, the array substrate may further include fourth connecting lines 30, which may be located in the bending area 231 and extend along the first direction. The fourth connecting lines 30 may be electrically connected with the third connecting lines 28 in a one-to-one correspondence.

In some examples, the second data lines 25 may be connected, via the second connecting lines 27, other structures, and the line-switching connecting units 32, to the connecting ports in the arrangement order of the second data lines 25, so as to achieve electrical connections with corresponding output pins on the driver integrated circuit chip. The other structures may be determined based on the specific structure of the array substrate and are not limited herein. For example, if the array substrate includes the third connecting lines 28, the second data lines 25 may be electrically connected, via the second connecting lines 27, the third connecting lines 28, and the line-switching connecting units 32, with the connecting ports in the arrangement order of the second data lines 25. For another example, if the array substrate includes the third connecting lines 28 and the fourth connecting lines 30, the second data lines 25 may be electrically connected, via the second connecting lines 27, the third connecting lines 28, the fourth connecting lines 30, and the line-switching connecting units 32, with the connecting ports in the arrangement order of the second data lines 25.

In some embodiments, the second connecting lines 27 and the second data lines 25 may be arranged in a same layer, i.e., the second connecting lines 27 and the second data lines 25 may be located in a same metal layer. For example, if the array substrate is a conventional flexible array substrate, the array substrate may include a first metal layer M1, a second metal layer M2, a third metal layer M3, and a fourth metal layer M4, which are usually used as signal line metal layers. In some examples, the first data lines 24 and the second data lines 25 may be located in the third metal layer M3 and/or the fourth metal layer M4, and correspondingly, the second connecting lines 27 may also be located in the third metal layer M3 and/or the fourth metal layer M4.

In some other embodiments, the second connecting lines 27 and the second data lines 25 are arranged in different layers. The second connecting lines 27 are located in a target metal layer which may be located between a substrate and an active layer. Specifically, a metal layer (i.e., the target metal layer) may be added into the array substrate to implement the second connecting lines. A metal layer including the first data lines 24 and the second data lines 25 may be located between the active layer and an anode metal layer. The second connecting lines 27 and the second data lines 25 are arranged in different layers, so that the wiring of the second connecting lines in the display area is more flexible. Under a condition that the second connecting lines 27 and the second data lines 25 are arranged in different layers, the second connecting lines 27 and the second data lines 25 may be electrically connected via through-holes.

The present application further provides a display module which may include the array substrate in the above embodiments. The display module according to the embodiments of the present application may utilize the COP package, the COF package, or the COG package, which is not limited herein.

Figure 15:
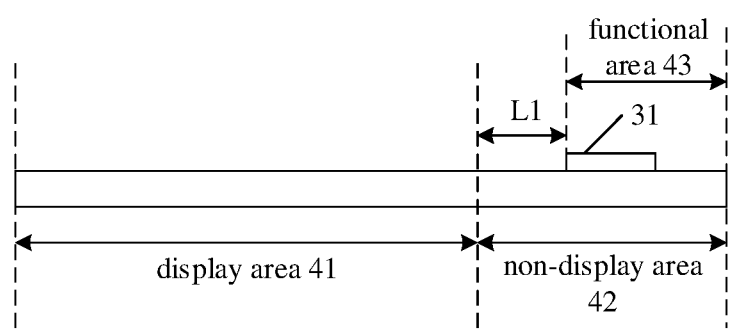
FIG. 15 shows a schematic sectional view of an example of a display module according to the embodiments of the present application.

In some examples, the display module utilizes the COG package. As shown in FIG. 15, the display module includes a display area 41 and a non-display area 42. The non-display area 42 includes a functional area 43. The driver integrated circuit chip 31 is located in the functional area 43. The distance L1 between the display area 41 and the functional area 43 in FIG. 15 is substantially the same as the distance d3 as shown in FIG. 2, FIG. 4, and FIG. 9. The distance d3 between the display area 21 and the functional area 23 of the array substrate can be further reduced, and correspondingly, the distance L1 between the display area 41 and the functional area 43 of the display module can be further reduced, therefore the width of the frame of the display module can be further reduced and a narrower frame can be achieved for the display module.

Figure 16:
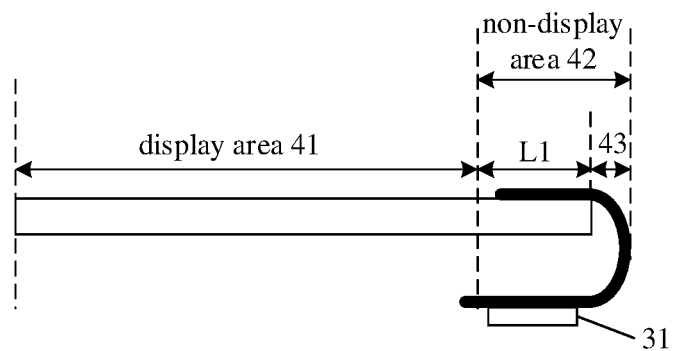
FIG. 16 shows a schematic sectional view of another example of a display module according to the embodiments of the present application.

In some other examples, the display module utilizes the COF package. As shown in FIG. 16, the display module includes a display area 41 and a non-display area 42. The non-display area 42 includes a functional area 43. The functional area 43 may specifically include the bending area in the above embodiments. The driver integrated circuit chip 31 is located on a line bent to the back side of the array substrate. The distance L1 between the display area 41 and the functional area 43 in FIG. 16 is substantially the same as the distance d3 as shown in FIG. 2, FIG. 4, FIG. 9, and FIG. 11. The distance d3 between the display area 21 and the functional area 23 of the array substrate can be further reduced, and correspondingly, the distance L1 between the display area 41 and the functional area 43 of the display module can be further reduced, therefore the width of the frame of the display module can be further reduced and a narrower frame can be achieved for the display module.

Figure 17:
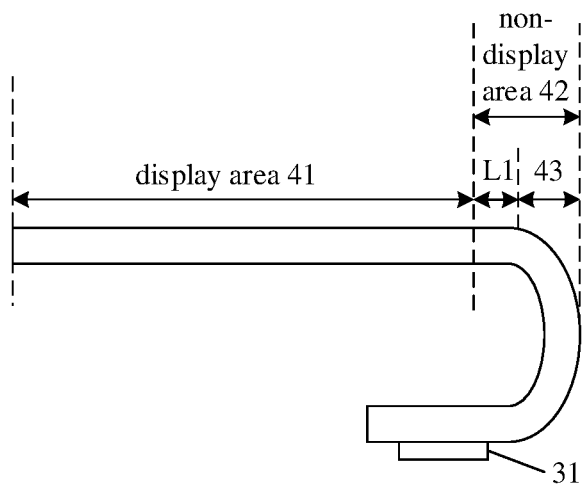
FIG. 17 shows a schematic sectional view of yet another example of a display module according to the embodiments of the present application.

In yet some other examples, the display module utilizes the COP package. As shown in FIG. 17, the display module includes a display area 41 and a non-display area 42. The non-display area 42 includes a functional area 43. The functional area 43 may specifically include the bending area in the above embodiments. The array substrate is a flexible array substrate that can be bent to the back side, and the driver integrated circuit chip 31 is located on the flexible array substrate that is bent to the back side. The distance L1 between the display area 41 and the functional area 43 in FIG. 17 is substantially the same as the distance d3 as shown in FIG. 2, FIG. 4, FIG. 9, and FIG. 11. The distance d3 between the display area 21 and the functional area 23 of the array substrate can be further reduced, and correspondingly, the distance L1 between the display area 41 and the functional area 43 of the display module can be further reduced, therefore the width of the frame of the display module can be further reduced and a narrower frame can be achieved for the display module.

The present application further provides a display apparatus including the display module in the above embodiments. Specifically, the display apparatus may be a cell phone, a computer, a tablet computer, a television, an electronic paper, and other apparatuses having display function, which is not limited herein.

It should be noted that various embodiments in the present specification are described in a progressive manner, the same or similar parts in the various embodiment can be referred to each other, and each embodiment focuses on the differences from other embodiments. For the display module embodiments and the display apparatus embodiments, the relevant parts can be found in the description of the array substrate embodiments. The present application is not limited to the particular steps and structures described above and illustrated in the figures. Those skilled in the art can make various changes, modifications and additions or change the order of the steps after understanding the gist of the present application. Moreover, for the sake of brevity, the detailed description of known method techniques is omitted herein.

What is claimed is:

1. An array substrate, comprising:
   a display area comprising a central area and an edge area located on at least a side of the central area along a second direction;
   a non-display area comprising a functional area spaced from the display area in a first direction;
   a plurality of first data lines located in the central area and extending along the first direction, the plurality of first data lines being arranged at intervals along the second direction;
   a plurality of second data lines located in the edge area and extending along the first direction, the plurality of second data lines being arranged at intervals along the second direction;
   a plurality of first connecting lines located between the central area and the functional area and extending along the first direction, the first connecting lines being electrically connected with the first data lines in a one-to-one correspondence;
   a plurality of second connecting lines electrically connected with the second data lines in a one-to-one correspondence, the second connecting line comprising a first connecting line segment and a second connecting line segment distributed successively, the second connecting line segment extending along the first direction between the central area and the functional area;
   wherein the functional area comprises a bending area, under a condition that a length of the bending area along the second direction is less than a length of the functional area along the second direction, the array substrate further comprises a plurality of third connecting lines, the third connecting lines are electrically connected with the second connecting line segments and the first connecting lines in a one-to-one correspondence, an area on the array substrate in which the plurality of third connecting lines are located forms a sector wiring area.

2. The array substrate of claim 1, wherein the plurality of first connecting line segments comprise a plurality of first connecting sub-line segments extending along the second direction and a plurality of second connecting sub-line segments extending along the first direction, the plurality of first connecting sub-line segments are electrically connected with the plurality of second connecting sub-line segments.

3. The array substrate of claim 1, wherein a part of at least one first connecting line segment extending along the first direction is located between adjacent two of the first data lines.

4. The array substrate of claim 1, wherein
   the first connecting line segment is a bending line extending in the display area, and
   the array substrate further comprises a plurality of line-switching connecting units configured to be electrically connected with the second connecting lines and connecting ports, so that the second data lines are electrically connected, via the second connecting lines and the line-switching connecting units, with the connecting ports arranged in an order corresponding to an arrangement order of the second data lines, the connecting ports being electrically connected with a driver integrated circuit chip.

5. The array substrate of claim 4, wherein the plurality of line-switching connecting units comprises:
line-switching connecting lines electrically connected with the second connecting lines in a one-to-one correspondence and electrically connected with the connecting ports in an order corresponding to the connected second connecting lines.

6. The array substrate of claim 5, wherein the line-switching connecting lines comprise a plurality of first line-switching connecting line segments extending along the second direction and a plurality of second line-switching connecting line segments extending along the first direction, the plurality of first line-switching connecting line segments are electrically connected with the second connecting lines and the plurality of second line-switching connecting line segments, the plurality of second line-switching connecting line segments are electrically connected with the connecting ports.

7. The array substrate of claim 6, wherein at least one of the plurality of first line-switching connecting line segments extends in a direction from the edge area to the central area and beyond the second connecting line connected with the first line-switching connecting line segment.

8. The array substrate of claim 6, wherein the plurality of first line-switching connecting line segments extend in a direction from the edge area to the central area and beyond the second connecting line nearest to a center of the central area.

9. The array substrate of claim 1, wherein the array substrate further comprises a plurality of fourth connecting lines located in the bending area and extending along the first direction, the fourth connecting lines are electrically connected with the third connecting lines in a one-to-one correspondence.

10. The array substrate of claim 1, further comprising:
compensation lines located between the connecting ports and the driver integrated circuit chip and extending along the first direction, the compensation lines being electrically connected with the first connecting lines.

11. The array substrate of claim 1, wherein the second connecting lines and the second data lines are arranged in a same layer.

12. The array substrate of claim 1, wherein the second connecting lines and the second data lines are arranged in different layers, and the second connecting lines are located in a target metal layer between a substrate and an active layer.

13. The array substrate of claim 12, wherein a metal layer comprising the second data lines is located between the active layer and an anode metal layer.

14. The array substrate of claim 12, wherein the second connecting lines and the second data line are electrically connected via through-holes.

15. The array substrate of claim 1, wherein the edge area comprises an area of the central area protruding relative to the functional area along the second direction.

16. An array substrate, comprising:
a display area comprising a central area and an edge area located on at least a side of the central area along a second direction;
a non-display area comprising a functional area spaced from the display area in a first direction;
a plurality of first data lines located in the central area and extending along the first direction, the plurality of first data lines being arranged at intervals along the second direction;
a plurality of second data lines located in the edge area and extending along the first direction, the plurality of second data lines being arranged at intervals along the second direction;
a plurality of first connecting lines located between the central area and the functional area and extending along the first direction, the first connecting lines being electrically connected with the first data lines in a one-to-one correspondence;
a plurality of second connecting lines electrically connected with the second data lines in a one-to-one correspondence, the second connecting line comprising a first connecting line segment and a second connecting line segment distributed successively, the first connecting line segment being a bending line extending in the display area, the second connecting line segment extending along the first direction between the central area and the functional area; and
a plurality of line-switching connecting units configured to be electrically connected with the second connecting lines and connecting ports, so that the second data lines are electrically connected, via the second connecting lines and the line-switching connecting units, with the connecting ports arranged in an order corresponding to an arrangement order of the second data lines, the connecting ports being electrically connected with a driver integrated circuit chip;
wherein the functional area comprises a bending area,
under a condition that a length of the bending area along the second direction is equal to a length of the functional area along the second direction, the first connecting lines and the second connecting line segments extend into the bending area along the first direction.

17. An array substrate, comprising:
a display area comprising a central area and an edge area located on at least a side of the central area along a second direction;
a non-display area comprising a functional area spaced from the display area in a first direction;
a plurality of first data lines located in the central area and extending along the first direction, the plurality of first data lines being arranged at intervals along the second direction;
a plurality of second data lines located in the edge area and extending along the first direction, the plurality of second data lines being arranged at intervals along the second direction;
a plurality of first connecting lines located between the central area and the functional area and extending along the first direction, the first connecting lines being electrically connected with the first data lines in a one-to-one correspondence;
a plurality of second connecting lines electrically connected with the second data lines in a one-to-one correspondence, the second connecting line comprising a first connecting line segment and a second connecting line segment distributed successively, the second connecting line segment extending along the first direction between the central area and the functional area;
wherein a metal layer comprising the second data lines is located between an active layer and an anode metal layer, and
the second connecting lines and the second data line are electrically connected via through-holes.

18. The array substrate of claim 17, wherein
the array substrate further comprises a plurality of line-switching connecting units configured to be electrically connected with the second connecting lines and connecting ports, so that the second data lines are electrically connected, via the second connecting lines and the line-switching connecting units, with the connecting ports arranged in an order corresponding to an arrangement order of the second data lines, the connecting ports being electrically connected with a driver integrated circuit chip;

the second connecting lines and the second data lines are arranged in different layers, and the second connecting lines are located in a target metal layer between a substrate and the active layer; and the first connecting line segment is a bending line extending in the display area.

* * * * *